(12) United States Patent
Satoh et al.

(10) Patent No.: US 6,736,147 B2
(45) Date of Patent: May 18, 2004

(54) SEMICONDUCTOR-PROCESSING DEVICE PROVIDED WITH A REMOTE PLASMA SOURCE FOR SELF-CLEANING

(75) Inventors: Kiyoshi Satoh, Tama (JP); Kazuo Sato, Tama (JP); Hideaki Fududa, Tama (JP)

(73) Assignee: ASM Japan K.K., Tama (JP)

( * ) Notice: Subject to any disclaimer, the term of this patent is extended or adjusted under 35 U.S.C. 154(b) by 330 days.

(21) Appl. No.: 09/764,523

(22) Filed: Jan. 18, 2001

(65) Prior Publication Data
US 2002/0011210 A1 Jan. 31, 2002

Related U.S. Application Data
(60) Provisional application No. 60/176,592, filed on Jan. 18, 2000.

(51) Int. Cl.[7] .............................. B08B 6/00; C25F 1/00; C25F 3/30; C25F 5/00
(52) U.S. Cl. ................ 134/1.1; 134/1; 134/2; 134/3; 134/11; 134/21; 134/31; 156/345; 156/643.1; 156/646.1; 156/657.1
(58) Field of Search ............................ 134/1, 1.1, 2, 3, 134/31, 21, 37, 11; 156/345, 643.1, 646.1, 657.1

(56) References Cited

U.S. PATENT DOCUMENTS

| | | |
|---|---|---|
| 4,859,303 A | 8/1989 | Kalnitsky et al. |
| 5,769,950 A | 6/1998 | Takasu et al. |
| 5,788,778 A | 8/1998 | Shang et al. .................... 134/1 |
| 5,788,799 A | 8/1998 | Steger et al. ................ 156/345 |
| 5,807,614 A | 9/1998 | Sindzingre et al. |
| 5,844,195 A | 12/1998 | Fairbairn et al. ...... 219/121.43 |
| 5,939,831 A | 8/1999 | Fong et al. |

FOREIGN PATENT DOCUMENTS

| | | |
|---|---|---|
| EP | 91109362.3 | 12/1991 |
| EP | 92121311.2 | 8/1993 |
| WO | PCT/US98/21806 | 10/1998 |
| WO | PCT/US99/15867 | 7/1999 |

*Primary Examiner*—Randy Gulakowski
*Assistant Examiner*—Gentle E. Winter
(74) *Attorney, Agent, or Firm*—Knobbe Martens Olson & Bear LLP (57) ABSTRACT

A plasma CVD device includes a reaction chamber, a remote plasma discharge chamber that is provided remotely from the reaction chamber, and piping that links the reaction chamber and the remote plasma discharge chamber. The remote plasma discharge chamber activates cleaning gas by plasma discharge energy, and the activated cleaning gas is introduced into the inside of the reaction chamber through the piping and changes solid substances that adhere to the inside of the reaction chamber in consequence of film formation, to gaseous substances, thereby cleaning the inside of the reaction chamber. The device is characterized by at least one of the following: (a) the remote plasma discharge chamber generates active species using radio frequency oscillating output energy of a preselected frequency; (b) the piping is made of materials that are not corroded by the active species; or (c) the piping is provided with a through-flow type valve.

7 Claims, 5 Drawing Sheets

SEMICONDUCTOR-PROCESSING DEVICE PROVIDED WITH A REMOTE PLASMA SOURCE FOR SELF-CLEANING

REFERENCE TO RELATED APPLICATION

The present application claims the priority benefit under 35 U.S.C. §119(e) to provisional application No. 60/176,592, filed Jan. 18, 2000.

BACKGROUND OF THE INVENTION

1. Field of the Invention

This invention relates to a CVD (chemical vapor deposition) device equipped with a self-cleaning device. In particular, the invention relates to a device that cleans the inside of a deposition chamber using remotely generated active species.

2. Description of the Related Art

CVD devices have been conventionally used to form insulation films such as silicon oxide, silicon nitride, amorphous carbon or polymer containing benzene ring, conductor films such as tungsten silicide, titanium nitrite or aluminum alloy and high-dielectric films containing PZT ($PbZr_{1-x}Ti_xO_3$) or BST ($Ba_xSr_{1-x}TiO_3$) on silicon a substrate or glass substrate.

To form these films, reaction gas with various compositions or a second reaction gas is supplied within a deposition chamber. These gases cause a chemical reaction by receiving plasma energy and a desired thin film is formed on a semiconductor substrate. Within a reaction chamber, films that are generated similarly by chemical reaction adhere to its inner wall and the surface of a wafer support. These adhesive substances are accumulated gradually as film formation is repeated. Then, disengaging from the inner wall and the surface of the support, these adhesive substances sometimes float within the reaction chamber. This causes impurity contamination that leads to defects in manufactured semiconductor circuits.

To remove contaminants adhering to the inner wall of the reaction chamber, in situ cleaning that cleans the inside while the reaction chamber is in operation is effective. This method is to remove adhesive substances by bringing cleaning gas, which is selected according to the type of adhesive substances, into the reaction chamber to decompose the adhesive substances into gaseous materials. For example, if silicon oxide or silicon nitride, tungsten or its nitride or silicide adheres, $CF_4$, $C_2F_6$, $C_3F_8$ or $NF_3$ is used as cleaning gas. In this case, active species (fluorine radical) of fluorine atoms or fluorine-containing active species decomposes the substances adhering to the inner wall of the reaction chamber and impurities can be removed in the gas phase.

In the case of a plasma CVD device, because a plasma excitation device used for film formation is also used for activation of cleaning gas, large ion bombardment is caused between electrodes by high radio frequency (RF) power applied to the cleaning gas. As a result, the surface of electrodes is damaged; a surface layer comes off to cause impurity contamination. It becomes necessary to replace damaged parts frequently, which increases operation cost.

To solve these shortcomings caused by ion bombardment, remote plasma cleaning was developed. In U.S. Pat. No. 5,788,778, issued Aug. 4, 1998, and U.S. Pat. No. 5,844,195, issued Dec. 1, 1998, which are herein incorporated by reference, a method is disclosed in which $NF_3$ is used as a cleaning gas and plasma excitation that activates $NF_3$ is performed using microwaves in the second plasma discharge chamber, which is different and is separated from the reaction chamber. According to this method, flow-controlled $NF_3$ is brought into the second plasma discharge chamber, it is dissociated and activated by 2.45 GHz microwaves supplied to the plasma discharge chamber from a microwave oscillator through a waveguide, and fluorine active species are generated. At this time, to achieve microwave plasma discharge efficiently, a valve is provided between the second plasma reaction chamber and the reaction chamber to regulate pressure and the second plasma reaction chamber is maintained at a designated pressure. Generated fluorine active species are brought into the deposition chamber through a conduit, and it decomposes and removes adhesive substances on the inner wall of the reaction chamber.

In U.S. Pat. No. 5,788,799, issued Aug. 4, 1998, which is herein incorporated by reference, it is disclosed that for the conduit that brings fluorine active species into the reaction chamber, aluminum is preferable to stainless steel and that Teflon materials such as polytetrafluoroethylene (PTFE) are the most preferable.

In U.S. Pat. No. 5,844,195, issued Dec. 1, 1998, which is herein incorporated by reference, along with activation of cleaning gas in the second plasma discharge chamber, it is disclosed that cleaning gas is supplementarily activated further using radio-frequency plus true electric discharge in the reaction chamber and that a filter is provided between the second plasma discharge chamber and the reaction chamber to remove undesirable particles. This technology is also reflected in the teachings of U.S. Pat. No. 5,788,778.

While the above-mentioned remote plasma cleaning methods alleviated the problems caused by ion bombardment, there remains a need for improvement in these methods.

SUMMARY OF THE INVENTION

Among various embodiments of the present invention, an embodiment is to provide a remote plasma discharge chamber comprising materials that are resistant to damage, and at the same time, to provide reaction chamber cleaning without ion bombardment.

Another embodiment of this invention is to provide a CVD device in which plasma ignition at the remote plasma discharge chamber is easy and reliable.

Yet another embodiment of this invention is to provide a CVD device that quickly exhausts residual gas within piping after supply of activation cleaning gas is stopped.

Further, another embodiment of this invention is to provide a plasma CVD device that supplies cleaning gas to the reaction chamber by maintaining the amount of fluorine species that is activated in the remote plasma discharge chamber.

That is, a plasma CVD device according to this invention includes the following embodiments:

The CVD device of the preferred embodiments comprises a reaction chamber, a remote plasma discharge chamber that is provided remotely from the reaction chamber, and piping that links the reaction chamber with the remote plasma discharge chamber. The remote plasma discharge chamber activates cleaning gas by plasma discharge energy. The activated cleaning gas is brought into the inside of the reaction chamber through the piping and changes solid substances, which adhere to the inside of the reaction chamber as a consequence of film formation, to gaseous substances, thereby cleaning the inside of the reaction chamber. The device is characterized by at least one of the following:

(a) the remote plasma discharge chamber generates active species using radio-frequency oscillating output energy of a preselected frequency;
(b) the piping is made of materials that are not corroded by the active species; or
(c) the piping is provided with a through-flow type valve.

According to one embodiment, the device further comprises a support provided within the reaction chamber, which supports an object to be or being processed, and a gas-emitting plate provided at a position facing the support within the reaction chamber. The plate uniformly supplies reaction gas to the object being processed to form a film onto the object being processed, wherein the activated cleaning gas is supplied through piping into the reaction chamber from holes provided through the gas-emitting plate.

With regard to (a) above, in an embodiment, the preselected frequency is 300 kHz-500 kHz and the active species is a fluorine activated species. With regard to (b) above, in an embodiment, the inside surface of the piping is made of fluorine-passivated stainless steel, aluminum or aluminum alloy. With regard to (c) above, in an embodiment, the size of the opening of the valve, when fully opened, is substantially equal to the inner diameter of the piping, and the valve does not have projections, when fully opened, with respect to the inner surface of the piping. Namely, the valve has an opening, when fully opened, such that the pressure drop across the valve is preferably less than about 0.25 Torr (or less than about 5% of the inlet pressure), more preferably less than about 0.1 Torr (or less than about 1% of the inlet pressure), and most preferably substantially no pressure loss is caused. In the above, the piping is preferably straight in the vicinity of the valve. Most preferably, all three of these features are combined to produce an efficient, self-cleaning CVD reactor.

As a result of (a), the following advantages can be realized: use of radio-frequency (e.g., 400 kHz) oscillating output allows manufacturing the remote plasma discharge chamber from anodized aluminum alloy, for example. Thus, it is unnecessary to use sapphire or quartz, which are required when conventional microwave output is used. Risk of damage during processing and problems of fluorine active species consumption are thereby reduced. In addition, damage to electrodes by ion bombardment at the time of cleaning and deterioration of electrode surfaces can successfully be prevented. Moreover, complex tuning circuits are unnecessary and miniaturization of the remote plasma discharge chamber and lower cost can be realized. Furthermore, a phenomenon wherein powdered aluminum fluoride adsorbs onto the electrode surface is reduced or eliminated and device downtime due to device maintenance can be considerably shortened. As a result, productivity is improved.

As a result of (b), the following advantages can be realized: use of materials inert to fluorine active species for internal surfaces of the piping and the valve, instead of resin materials such as PFA, adsorption of fluorine active species or fluoride gas onto the internal surface of the piping or the valve can be eliminated. Thus, the occurrence of fluorine active species or fluoride gas being released from the internal surface of the piping and the valve after cleaning is completed and remaining within the remote plasma discharge chamber is reduced or eliminated. Accordingly, the occurrence of plasma ignition failure can be controlled. Moreover, when supply of fluorine-containing gas is stopped, fluorine active species is promptly discharged from the piping and the remote plasma discharge chamber. Reduction of fluorine adsorption also increases the amount of fluorine active species brought into the reaction chamber, thereby maintaining the activity of active species and improving cleaning efficiency.

As a result of (c), the following advantages can be realized: use of rectilinear piping with a large internal diameter and a valve that does not restrict flow between the remote plasma discharge chamber and the reaction chamber, deactivation (recombination) of fluorine active species is reduced, due to reduced collisions with the piping surface and structure within the valve. Accordingly, applying radio frequency power of less than 3,000 W to the remote plasma discharge chamber, high-speed cleaning at over 2 micron/min becomes possible. Furthermore, reduced collisions also minimizes thermal energy generated when fluorine active species is deactivated, thus reducing overheating of the piping and the valve. Heat damage to O-rings and other components, and consequent generation of particles is also reduced or eliminated. The frequency with which damaged parts are replaced thus decreases, and operating costs of the device can be decreased while at the same time increasing productivity of the device.

The skilled artisan will readily appreciate in view of the present disclosure that, while each of features (a), (b), and (c) are advantageous in and of themselves, combining two or all of (a), (b) and (c) will synergistically enhance the advantageous effects.

BRIEF DESCRIPTION OF THE DRAWINGS

These and other aspects of the invention will be readily apparent from the detailed description below and the appended drawings, which are meant to illustrate and not to limit the invention, in which like reference numerals are used to indicated like parts, and in which:

FIGS. 4(*a*) and 4(*b*) are schematic diagrams, each showing a cross-sectional view of a valve employed by the preferred embodiments; FIG. 4(*a*) shows a closed state of the valve, and FIG. 4(*b*) shows an open state of the valve.

DETAILED DESCRIPTION OF THE PREFERRED EMBODIMENTS

Problems of Conventional Remote Plasma Source Technology

The conventional remote plasma source technology discussed earlier entails the following problems:

First, to use microwave plasma, it is necessary to manufacture the second plasma discharge chamber using microwave-transparent materials, such as sapphire and quartz. Such materials tend to break easily, particularly under thermal stresses of plasma generation, and it is difficult to connect them with metal conduits or piping. Also, it is necessary to replace quartz regularly because it is easily etched by fluorine active species. Although sapphire is resistant to etching by fluorine active species, sapphire is expensive, and hence it increases the cost of a device.

Further, in connection with the material used for the piping connecting the reaction chamber and the remote plasma discharge chamber, the following problems are caused:

The internal surface of the piping that brings fluorine species into the reaction chamber is typically made of Teflon™ or similar materials. Teflon™, however easily adsorbs or absorbs the products of dissociating fluoride and $NF_3$ gases. Dissociated or recombined plasma products from $NF_3$ gas, which is absorbed on the internal surface of the piping, is released from the internal surface of the piping after supply of cleaning gas is stopped. It remains within the piping and its residual gas diffuses to reaction chamber. When the reaction chamber comprises a second plasma discharge chamber, the released gases can cause ignition failure of plasma discharge. Moreover, chemical reaction can occur if reaction gas for film formation flows into an area where residual gas remains, and undesired films, particles or powder are generated within the piping. These products accumulate within the piping, later flow into the reaction chamber, and cause impurity contamination on the semiconductor substrate surface. To prevent this from happening, it is possible to remove residual gas by purging the inside of the piping using helium or argon gas for many hours. However, this process remarkably lowers the productivity of the semiconductor-processing device.

Furthermore, if the internal surface of the piping that brings fluorine active species into the reaction chamber is made of stainless steel, aluminum, or aluminum alloy, fluoride is formed due to reaction between the surface within the piping and fluorine active species, and the amount of fluorine active species brought into the reaction chamber is decreased. As a result, the cleaning time of the reaction chamber increases and the productivity of the device drops.

In connection with the structure or function of the piping connecting the reaction chamber and the remote plasma discharge chamber, the following problems are caused:

To realize a faster cleaning rate, high power microwave energy can be used to generate the plasma. However, such energetic plasma causes the remote plasma chamber to deteriorate, and particles which pollute the downstream reaction chamber are generated. Providing a filter between the deposition chamber and the reaction chamber to prevent these undesirable particles from flowing into the reaction chamber lowers the cleaning rate due to deactivation or recombination of fluorine active species, which is mentioned later. Thus the primary object of hastening the cleaning rate is negated.

Further, within the remote plasma discharge chamber, to dissociate $NF_3$ with high efficiency to generate fluorine active species, a pressure of about 4–20 Torr pressure is required within the remote plasma discharge chamber. To achieve this pressure, a valve to regulate pressure is provided between the remote plasma chamber and the downstream reaction chamber. Pressure within the remote plasma chamber can be increased by keeping the valve only partially open, leaving some obstruction within the flow path. However, restricting the flow using a valve to raise pressure creates different inconveniences, such as deactivation of fluorine active species and plasma burning. Fluorine active species generated within the remote plasma discharge chamber is deactivated by contact with the metal surface. While being brought into the reaction chamber where film formation is performed through a conduit, generated fluorine active species returns to molecules by colliding with the valve that restricts the flow by narrowing a passage, or it is deactivated by reacting with the valve surface. As a result, the amount of fluorine active species declines. Similarly, if piping from the second plasma discharge chamber to the reaction chamber is too long or bends at an acute angle, due to higher contact probability with the piping surface en route or by colliding with the corner portion of the bent piping, the amount of fluorine active species decreases. Decreased fluorine active species lowers the cleaning rate within the downstream deposition chamber and results in insufficient cleaning.

Fluorine active species generated in the remote plasma discharge chamber radiates a great volume of heat energy when losing activation by contact with the metal surface. Because of this heat energy, the temperature of the contact surface rises. For piping connecting the second plasma discharge chamber to the reaction chamber and valves mounted on the piping, O-rings made of fluorine-containing rubber and other materials are typically used to seal the inside from the external environment. The above-mentioned overheating caused by contact with fluorine active species destroys O-rings. Particularly, within the above-mentioned valve for pressure regulation, there is a risk that O-rings are broken off. If the O-rings are damaged, piping airtightness cannot be maintained. As a result, impurity contamination occurs due to outside air penetration into the reaction chamber, or leakage of gases harmful to humans, such as fluorine active species, takes place. Deteriorated O-ring material flows within the piping to cause internal contamination to a semiconductor-processing device including the reaction chamber. Also, if fluorine-containing rubber (e.g., VITON® or Karlez® that is used for a movable part within the piping such as a shaft seal for the valves is overheated, it deteriorates, loses its elasticity and hinders mobility of the parts.

It is necessary to replace damaged parts frequently and this increases the operation cost. Needless to say, parts replacement reduces the operation hours of the device and lowers productivity.

On the other hand, if a valve with a stoppage function is not provided between the remote plasma discharge chamber and the downstream reaction chamber, reaction gas used when forming a film onto substrate within the reaction chamber can flow backward or diffuse from the deposition chamber to the remote plasma discharge chamber. The reaction gas can form solid substances on the remote plasma discharge chamber surfaces in a powdered state due to imperfect reaction. If these solid substances then in a powder state flow into the reaction chamber when forming a film, particles can contaminate the substrate. Moreover, reaction gas adsorbed on the internal surface of the remote plasma discharge chamber raises the ignition electric potential required for plasma discharge in the remote plasma discharge chamber. If the ignition electric potential value becomes higher than the design value for the remote plasma discharge chamber, it is possible that plasma discharge cannot be executed. To prevent backward flow and diffusion of reaction gas, the remote plasma discharge chamber is desirably sealable from the reaction chamber. However, this would obviously cause reduction of fluorine active species that can reach the reaction chamber and a satisfactory cleaning rate and performance can not be achieved.

Basic Structures of CVD Devices of the Preferred Embodiments

A CVD device according to this invention includes the following embodiments and can resolve the above problems:

The CVD device comprises a reaction chamber, a plasma discharge chamber that is provided remotely from the reaction chamber (i.e., a remote plasma source), and piping that links the reaction chamber and the remote plasma discharge chamber. The remote plasma discharge chamber activates cleaning gas by plasma discharge energy. The activated cleaning gas is brought into the inside of the reaction chamber through the piping and etches solid substances that adhere to the inside of the reaction chamber as a consequence of film formation, thereby cleaning the inside of the reaction chamber. The device is characterized by at least one of the following:

(a) The remote plasma discharge chamber generates active species using radio-frequency oscillating output energy of a preselected frequency;

(b) the piping is made of materials that are not corroded by the active species; or (c) the piping is provided with a through-flow type valve.

In several of the embodiments, the device further comprises a support provided within the reaction chamber, which supports an object to be or being processed, and a gas-emitting plate provided at a position facing the support within the reaction chamber in order to uniformly supply reaction gas to the object being processed to form a film onto the object being processed, wherein the activated cleaning gas is supplied through piping into the reaction chamber from holes provided on the gas-emitting plate.

In another embodiment, the device is configured for single-pass, horizontal, laminar gas flow through a cold-wall reactor. The device further comprises a susceptor provided within the reaction chamber, which supports an object to be processed and which adsorbs radiant heat provided through transparent chamber walls. The activated cleaning gas is supplied through an inlet in the chamber walls upstream of the susceptor.

Although each of (a), (b), and (c) can be adopted independently of each other, a combination of (a) and (b), for example, can include any of the following features:

The preselected frequency is about 300 kHz–500 kHz.

The active species is fluorine activated species.

The inside surface of the piping is made of fluorine-passivated stainless steel, aluminum, or aluminum alloy.

The CVD device includes a gas conduit to bring reaction gas into the reaction chamber separately from the cleaning gas.

The CVD device is configured for plasma CVD with structures for in situ plasma generation.

One end of the gas conduit is linked with the reaction chamber.

One end of the gas conduit is linked with the piping.

The CVD device includes a valve at a predetermined position of the piping between the remote plasma discharge chamber and the reaction chamber.

The inside of the valve is made of fluorine-passivated aluminum.

One end of the gas conduit is linked to the piping at a predetermined position between the valve and the reaction chamber.

For example, a combination of (a) and (c) can include any of the following features:

The preselected frequency is 300 kHz~500 kHz.

The active species is fluorine activated species.

The piping and valve are heated at a predetermined temperature.

A gas conduit to bring reaction gas into said reaction chamber is included.

One end of the gas conduit is linked to the reaction chamber.

One of the gas conduit is linked to the piping.

A combination of (a), (b), and (c) can be used to enhance the advantageous effects. The advantages of such features are described above.

Embodiment 1

Main Structures

A first embodiment will be explained with reference to FIG. 1.

Figure 1:
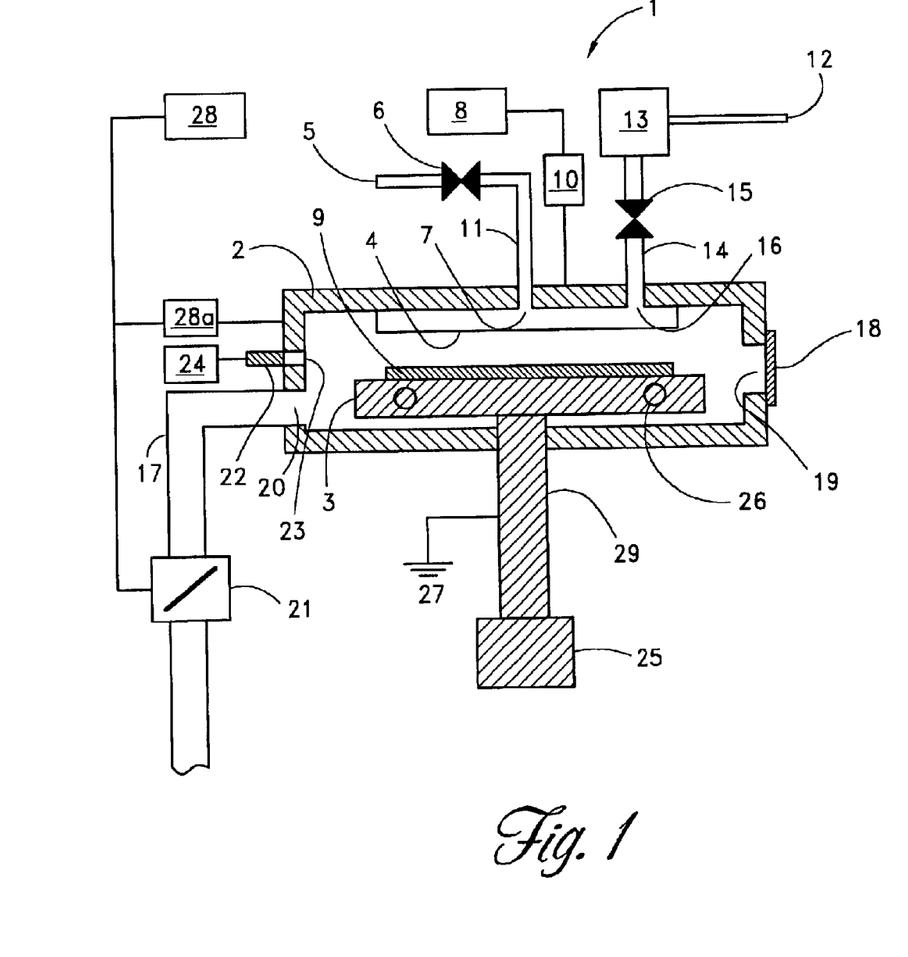
FIG. 1 is a schematic diagram showing a cross-sectional view of a substrate-processing device, constructed in accordance with a first embodiment of the present invention.

FIG. 1 is a schematic cross section of an exemplary a plasma CVD device according to this embodiment. A plasma CVD device 1, which is used to form a thin film on a semiconductor wafer 9 or other substrate, comprises a reaction chamber 2, a support 3 provided within the reaction chamber to support the semiconductor wafer 9, a showerhead 4 that is positioned to face the support 3 and is used to jet out reaction gas uniformly onto the semiconductor wafer 9, an outlet 20 to exhaust reaction gases and byproducts from the reaction chamber 2, and a remote plasma discharge chamber 13. The remote plasma discharge chamber 13 is positioned remotely from reaction chamber 2 and is linked to the showerhead 4 via piping 14 and valve 15. The remote plasma discharge chamber 13 has characteristics wherein it generates active species using radio-frequency oscillating output energy of the designated frequency and the piping 14 is made of materials that are not corroded by the active species.

On one side of the reaction chamber 2, an opening 19 is formed and the reaction chamber 2 is connected to a transfer chamber (not shown) to bring a semiconductor wafer or other substrate in and carry it out via a gate valve 18.

The support 3 that is provided within the reaction chamber 2 and is used to place the semiconductor wafer 9 is made of anodized aluminum or aluminum alloy and is grounded 27 to constitute one side of an electrode of plasma discharge. The reaction chamber 2 of the illustrated embodiment is thus a plasma CVD chamber configured for in situ (in chamber) plasma generation. Within the illustrated support 3, a ring-shape heating element 26 is embedded and the semiconductor wafer's temperature is controlled at a predetermined temperature using a temperature controller (not shown). The support 3 is connected to a driving mechanism 25 that moves the support 3 up and down through a support piston 29.

Within the reaction chamber 2, the showerhead 4 is provided at a position facing the support 3. In the showerhead 4, thousands of fine holes are provided to inject reaction gas onto the semiconductor wafer 9. The showerhead 4 is electrically connected to a radio-frequency oscillator 8 via matching circuit 10 and constitutes another electrode of plasma discharge. To bring reaction gas to be used for film formation from the showerhead 4, a reaction gas conduit 11 is connected to the piping 14. The number of the gas conduit 11 is not limited to one. According to the type of reaction gas, the necessary number of gas conduits can be installed. One end of the gas conduit 11 constitutes a gas inlet port 5 to cause reaction gas to flow in and the other end constitutes a reaction gas exit port 7 to cause gas to flow out to the showerhead 4. In the middle of the reaction gas conduit 11, a mass flow controller (not shown) and valve 6 are positioned.

On the side wall of the reaction chamber 2, an outlet 20 is provided. The outlet 20 is connected to a vacuum exhaust pump (not shown) through piping 17. Between the outlet 20 and the vacuum pump, a conductance-controlling valve 21 is provided to regulate pressure within the reaction chamber 2. The conductance-controlling valve 21 is electrically connected to an external regulator 28.

Additionally, a pressure gauge 28a is preferably provided to measure pressure within the reaction chamber 2. This pressure gauge 28a is electrically connected to the regulator 28.

Remote Plasma Discharge Chamber

The remote plasma discharge chamber 13 according to this embodiment is remotely provided from the reaction chamber 2. The remote plasma discharge chamber 13 is made of anodized aluminum alloy. The remote plasma discharge chamber 13 is linked to the showerhead 4 within the reaction chamber through piping 14. In the middle of the piping 14, a valve 15 is provided. The internal surface of this piping 14 is preferably made of fluorine-passivated stainless steel, but aluminum or fluorine-passivated aluminum alloy can be also used. Also similarly, the internal surface of the valve 15 is made of fluorine-passivated aluminum alloy. One end of the piping 14 constitutes a cleaning gas inlet port 12 to cause cleaning gas to flow in and the other end constitutes a cleaning gas exit port 16 to bring cleaning gas into the showerhead 4.

For cleaning gas flowing in from the cleaning gas inlet port 12, fluorine-containing gases such as nitrogen fluoride, carbon fluoride and chlorine fluoride, mixed gas of nitrogen or carbon fluoride or mixed gases of the foregoing gases with oxygen, nitrogen or inert gas can be used. Specifically, mixed gases of $NF_3$, $ClF_3$, $CF_4$, $C_2F_6$, $C_3F_8$ with oxygen, mixed gas of $NF_3$ with nitrogen, mixed gas of $NF_3$ with dilute gas can be used. For dilute gas, helium, argon, neon, xenon, or krypton can be used.

An observation window 23 is preferably also provided on the side wall of the reaction chamber 2 and a charged coupled device (CCD) detector 22 is mounted on the observation window. Furthermore, a monitor 24 is installed on the CCD detector 22. The observation window 23 is preferably made of sapphire, but aluminum oxide can also be used. Also, in addition to the CCD detector, a photomultiplier tube or a photoelectric converter can also be used.

Plasma CVD Operation

Operation of the plasma CVD device according to this embodiment is explained. Operation is roughly divided into two sequences: (1) a thin film formation sequence, forming a film on the semiconductor wafer 9, and (2) a cleaning sequence, cleaning surfaces on the inside of the reaction chamber. The thin film formation sequence is illustrated as forming silicon oxide on the semiconductor wafer 9 as an example.

First, the inside of the reaction chamber 2 is evacuated and exhausted by an external vacuum pump (not shown) through the outlet 20. Pressure within the reaction chamber can be regulated in a range from 1 Torr to 8 Torr by the degree of opening of the conductance-controlling valve 21.

Next, the support 3 heated by the heating element 26 controls the semiconductor wafer 9 at a designated temperature, preferably 300° C.–420° C. (572° F.–788° F.), using the temperature controller (not shown).

Figure 2:
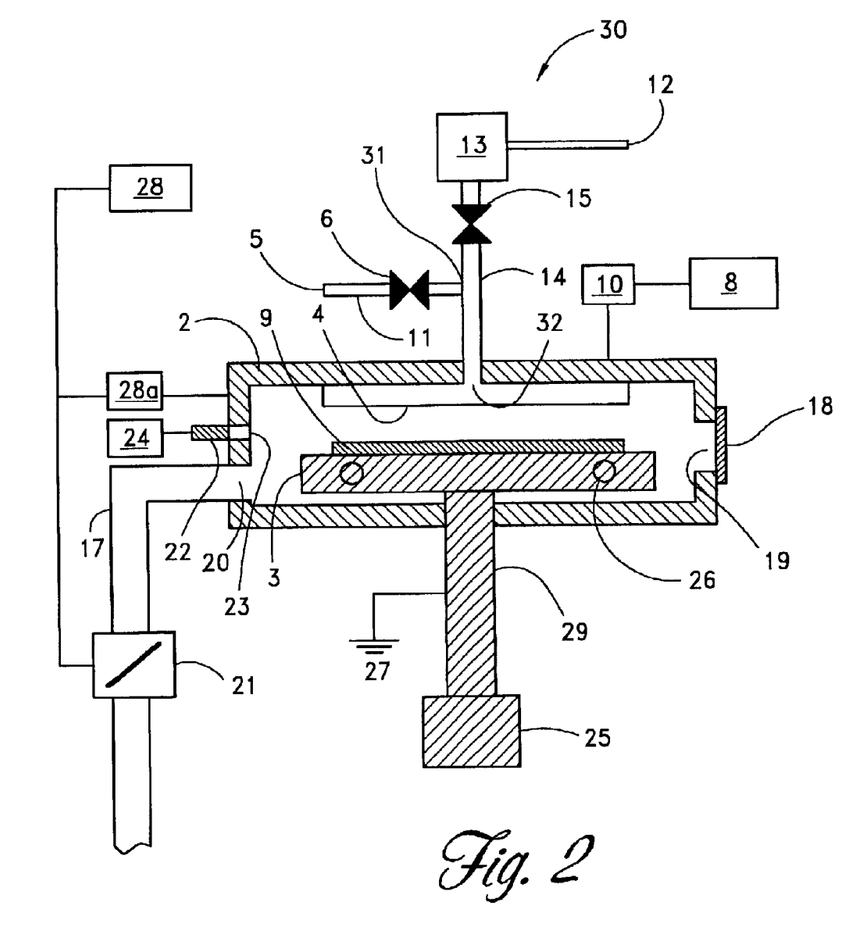
FIG. 2 is a schematic diagram showing a cross-sectional view of a substrate-processing device, constructed in accordance with a second embodiment of the invention.

Subsequently, reaction gases, $SiH_4$, $NH_3$ and $N_2$, the flow of which is controlled by the mass flow controller (not shown), flow in from a reaction gas inlet port 5 and are brought into the showerhead 4 through the gas exit ports 7 after passing the valve 6. In the embodiment of FIG. 2, described in more detail below, reaction gases $SiH_4$ and $NH_3$ flow in from the reaction gas inlet port 5 and only $N_2$ flows in from a cleaning gas inlet port 12. In this case, an influx of $SiH_4$ and $NH_3$ gases into the remote plasma discharge chamber 13 is prevented by $N_2$ gas that flows in from the inlet port 12, even though the valve 15 is not provided. Mixed reaction gases are injected uniformly from the fine holes formed at the lower side of the showerhead 4 onto the semiconductor wafer 9.

Radio-frequency power of 13.56 MHz or mixed power of 13.56 MHz and 430 kHz is applied to the showerhead 4 by the radio-frequency oscillator 8. As a result, a plasma reaction domain is formed in the space between the showerhead 4, which is serves as one electrode for in situ plasma generation within the reaction chamber 2, and the support 3, which serves as the other electrode. Molecules of the reaction gas within that domain are activated and ionized by plasma energy. Ionized molecules cause chemical reaction on semiconductor substrate 9 and silicon nitride is formed.

Upon termination of thin film formation processing, the valve 6 is closed and at the same time the gate valve 18 is opened. The processed semiconductor wafer 9 is carried out to an adjoining transfer chamber (not shown) by an automatic transfer robot (not shown) through the opening 19. After the reaction chamber 2 is evacuated and exhausted, an unprocessed semiconductor wafer is carried in from the transfer chamber, the gate valve 18 is closed, and the above sequence is repeated.

While the thin film formation sequence is continuously preformed, undesirable products adhere to the inner wall of the reaction chamber 2 and the surface and sides of the support. The undesirable products gradually accumulate, slough and float within the reaction chamber to cause particle contamination. Consequently, it is necessary to clean the inside of the reaction chamber 2 regularly (for example, after each thin film formation processing between wafer unloading and loading the next wafer). In the following, the cleaning sequence to remove silicon nitride adhering to the inner wall of the reaction chamber 2 is explained.

Cleaning Operation

Mixed gas of $NF_3$ and argon, which is used as cleaning gas, is provided at a designated flow rate into the cleaning gas inlet port 12 and is brought into the remote plasma discharge chamber 13. Preferred flow rates for the fluorine-containing gas are between about 0.5 slm and 1.5 slm; preferred flow rates for the carrier gas are about 0.5 slm and 4 slm. Desirably, the inert carrier gas is about 2 to 3 times the flow of the fluorine-containing gas. Within the remote plasma discharge chamber 13, radio-frequency output from 300 kHz to 500 kHz is applied to the flowing cleaning gas with power from 1,000 W to 5,000 W. With this energy, cleaning gas is dissociated and activated at a given efficiency and fluorine active species is generated.

Generated fluorine active species is brought into the showerhead 4 through the piping 14 and the valve 15, the inside of which has been fluorine-passivated. Fluorine active species that is injected into the reaction chamber 2 from the showerhead 4 causes chemical reaction with solid silicon nitride adhering to the inner wall and other surfaces of the reaction chamber 2 and changes the solid adhesive substance to a gaseous substance. As a result, the number of gas molecules within the reaction chamber increases, but pressure within the reaction chamber is always maintained at a specific value by a controller 28 that controls the opening size or angle of the conductance-controlling valve 21 in real-time in response to pressure within the reaction chamber measured by the pressure gauge 28a.

Initially when fluorine active species flows into the reaction chamber 2, fluorine active species and solid silicon nitride react violently and emit light. This emission of light is detected by the CCD detector through the observation window 23 and can be confirmed by the monitor 24. As time elapses, reaction between fluorine active species and solid silicon nitride subsides and it becomes impossible to confirm emission of light. Moreover, the opening angle of the conductance-controlling valve 21 approaches a certain value. When this opening angle nearly matches an opening angle of a value (saved in a memory) predetermined for a state where no adhesive substances exist, the controller 28 senses completion of cleaning and stops supplying $NF_3$ and at the same time continues to supply only argon gas. Argon gas completely purges fluorine active species that remains within the remote plasma discharge chamber 13, within the reaction chamber and within the piping 14, concluding the cleaning sequence.

Embodiment 2

Structures

FIG. 2 shows another example according to this embodiment. Unlike the plasma CVD device 1 of FIG. 1, a plasma CVD device 30 of FIG. 2 includes a link between one end of the reaction conduit 11 and piping 14 at a junction 31 positioned between the remote plasma discharge chamber 13 and a gas exit port 32. Reaction gas and cleaning gas are mixed at the junction 31 and are brought into a showerhead 4 from one gas inlet port 32. The device 30 can be otherwise similar to the device 1 of FIG. 1.

In the illustrated example, the valve 15 is set up at the plasma discharge chamber side before the junction 31. For the internal surface of the piping 14 and the valves 6, 15, preferably fluorine-passivated aluminum, aluminum alloy, stainless steel or nickel material is used, but aluminum or aluminum alloy can also be used. For sealing materials of the valves 6, 15, preferably fluorocarbon polymers such as PTFE (polytetrafluoroethylene), PFA (tetrafluoroethylene.perfluoroalkylvinyl ether copolymer) or PCTFE (polychlorotrifluoroethylene) or perfluoroelastomer is used, but resin or fluorine-containing rubber (e.g., VITON® or Kalrez® that has heat-resistance and corrosion resistance can also be used.

As a variation of the implementation example shown in FIG. 2, the valve 15 can be removed. In this case, one end of the reaction gas conduit 11 is connected to the piping 14 at a designated position between the remote plasma discharge chamber 13 and the gas exit port 32 and constitutes a junction.

Plasma CVD operation and cleaning operation can be conducted as described for Embodiment 1.

Embodiment 3

Main Structures

Figure 3:
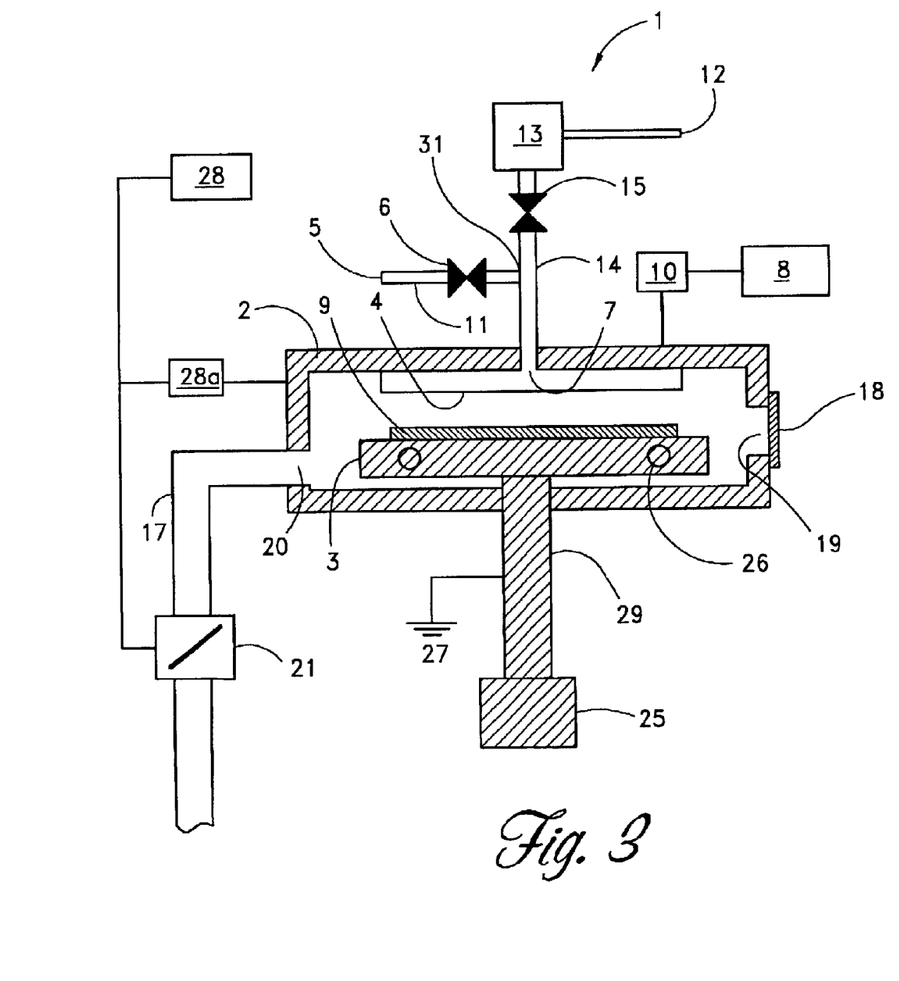
FIG. 3 is a schematic diagram showing a cross-sectional view of a substrate-processing device, constructed in accordance with a third embodiment of the invention.

FIG. 3 is a schematic diagram showing a cross sectional view of a preferable implementation example of a plasma CVD device according to this embodiment. A plasma CVD device 1, which is used to form a thin film on a semiconductor wafer 9 or other substrate, comprises a reaction chamber 2, a support 3 provided within the reaction chamber 2 to place the semiconductor wafer 9, a showerhead 4 that positioned facing the support 3 and is used to inject reaction gas uniformly onto the semiconductor wafer 9, an outlet 20 to exhaust the inside of reaction chamber 2. The remote plasma discharge chamber 13 is positioned remotely from reaction chamber 2 and is linked to the showerhead 4 via piping 14 and valve 15. The remote plasma discharge chamber 13 has characteristics wherein it generates active species using radio-frequency oscillating output energy of the designated frequency.

On one side of the reaction chamber 2, an opening 19 is formed and the reaction chamber 2 is connected to a transfer chamber (not shown) to bring a semiconductor wafer or other substrate in and carry it out via a gate valve 18.

The support 3 that is provided within the reaction chamber 2 and is used to place the semiconductor wafer 9 is made of anodized aluminum or aluminum alloy and is grounded 27 to constitute one electrode for in situ plasma discharge. The reaction chamber 2 of the illustrated embodiment is thus a plasma CVD chamber configured for in situ (in chamber) plasma generation. Within the support 3, a ring-shape heating element 26 is embedded and the semiconductor wafer's temperature is controlled at a designated temperature using a temperature controller (not shown). The support 3 is connected to a driving mechanism 25 that moves the support 3 up and down through a support piston 29.

The support 3 that supports the semiconductor wafer 9 is not necessarily limited to being made of anodized aluminum or aluminum alloy; instead a ceramic heater can be used. The ceramic heater has a ceramic plate, and a resistance heating element embedded and a metal element forms one electrode for in situ plasma discharge. The metal element is grounded to the electrode of plasma discharge if possible. A ceramic plate has excellent corrosion resistance to aluminum nitride, magnesium oxide, aluminum oxide, etc. and is made of material that has sufficient thermal conductivity to serve as a heater. For the resistance-heating element, tungsten is used. For the metal element constituting an electrode for in situ plasma discharge, tungsten or molybdenum can be used.

Within the reaction chamber 2, the showerhead 4 is provided at the position facing the support 3. In the showerhead 4, thousands of fine holes are provided to inject reaction gas onto the semiconductor 9. The showerhead 4 is electrically connected to a radio-frequency oscillator 8 via matching circuit 10 and makes up another electrode for the in situ plasma discharge. To bring reaction gas to be used for film formation from the showerhead 4, a reaction gas conduit 11 is connected to piping 14. The number of the gas conduit 11 is not limited to one. According to the type of reaction gas, the necessary number of gas conduits can be installed. One end of the gas conduit 11 constitutes a gas inlet port 5 to cause reaction gas to flow in and other end is connected to the piping 14 at the junction 31. Reaction gas is brought in from gas exit port 7 to the inside of the showerhead 4 via the piping 14. A mass flow controller (not shown) and the valve 6 are set up in the middle of the reaction gas conduit 11.

On the side wall of the reaction chamber 2, an outlet 20 is provided. The outlet 20 is connected to a vacuum exhaust pump (not shown) through piping 17. Between the outlet 20 and the vacuum pump, a conductance-controlling valve 21 is provided to regulate pressure within the reaction chamber 2. The conductance-controlling valve 21 is electrically connected to an external regulator 28.

A pressure gauge 28a is preferably provided to measure pressure within the reaction chamber. The pressure gauge is electrically connected to the regulator 28.

Remote Plasma Discharge Chamber

The remote plasma discharge chamber 13 of this embodiment, as noted, is positioned remotely from the reaction chamber 2. The remote plasma discharge chamber 13 is a radio-frequency electric discharge device that uses frequency in a radio frequency range from 300 kHz to 500 kHz. It is not desirable to use microwaves of around 2.45 GHz for the frequency of the remote plasma discharge chamber as mentioned earlier, because it requires an electric discharge chamber that deteriorates easily. In addition, if a frequency range from 1 MHz to 27 MHz is used, an automatic matching transformer must be installed between the radio-frequency oscillator and the remote plasma discharge chamber to realize stable plasma discharge. Adding this automatic matching transformer increases cost. At the same time, this is not desirable because it requires installing a remote plasma discharge chamber and an automatic matching transformer near the reaction chamber and because it may make maintenance work difficult by increasing the size of the entire semiconductor-processing device or losing space between the components. A frequency range of 300 kHz to 500 kHz efficiently enables activation of the cleaning gas, allows a plasma discharge chamber made of materials that do not easily deteriorate and realizes a more compact device itself. To realize a more stable plasma discharge, preferably the range is from 350 kHz to 450 kHz and more preferably it is 400 kHz to 430 kHz.

The remote plasma discharge chamber 13 is preferably made of anodized aluminum alloy. In the illustrated embodiment, the remote plasma discharge chamber 13 is linked to the showerhead 4 within the reaction chamber 2 through the piping 14. In the middle of the piping 14, a valve 15 is provided. The piping 14 is a straight-line structure. Its internal diameter is at least ½ inch, but preferably more than one inch. In addition, the valve 15 is characterized in that no structure to restrict the flow exists within the passage when it is open. The internal diameter of the open passage is not much extremely smaller than the piping 14 and preferably is the same. Consequently, when cleaning gas flows from the remote plasma discharge chamber to the reaction chamber, no appreciable pressure loss arises in the piping 14 and at the valve 15. Desirably, the pressure drop is less than about 0.25 Torr (or less than about 5% of the inlet pressure) across the valve 15, more preferably less than about 0.1 Torr (or less than about 1% of the inlet pressure).

The piping 14 is made of aluminum or aluminum alloy, but corrosion-resistant stainless steel can also be used. One end of the piping 14 is connected to the remote plasma discharge chamber 13 and other end constitutes a gas exit port 7 used to bring cleaning gas into the showerhead 4. Further, a cleaning gas inlet port 12 is provided to bring cleaning gas into the remote plasma discharge chamber 13. After being controlled at the designated flow by the mass flow controller (not shown), cleaning gas is brought into the cleaning gas inlet port 12.

The piping 14 and the valve 15 are preferably heated by a heater (not shown) to a temperature that prevents reaction gas and cleaning gas from adsorbing of the surfaces thereof. The temperature of the piping 14 and valve 15 can be selected according to the types of reaction gas and cleaning gas. Further, if needed, portions of the conduit 11, the valve 6 and the gas inlet port 5 can also be heated by heaters (not shown) at a designated temperature.

Through-Flow Type Valve

Figure 4A:
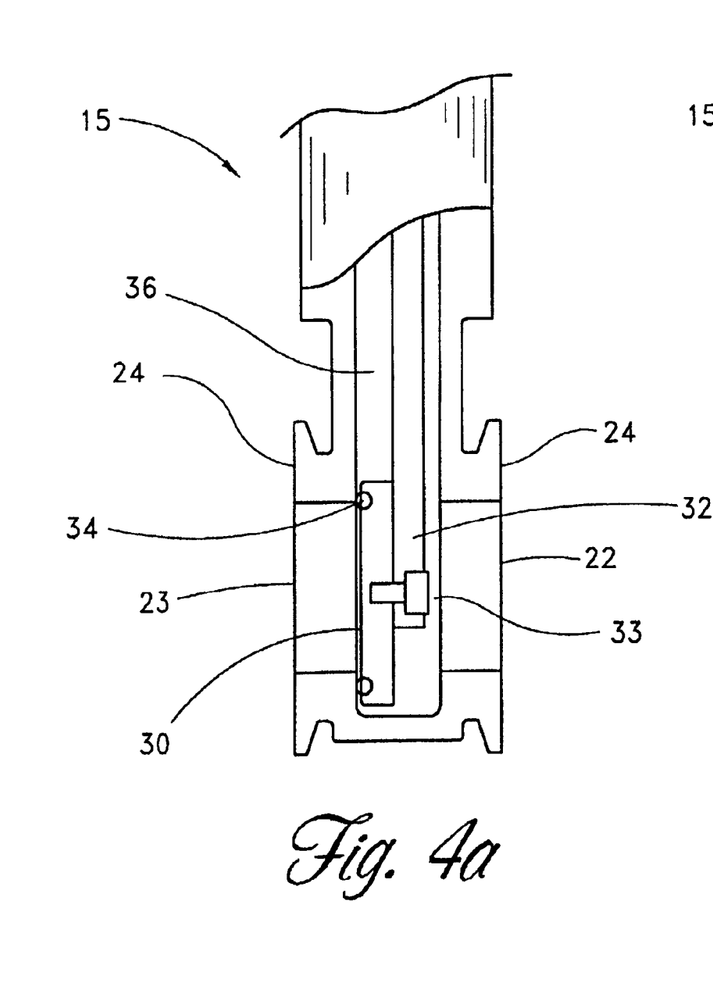
Figure 4B:
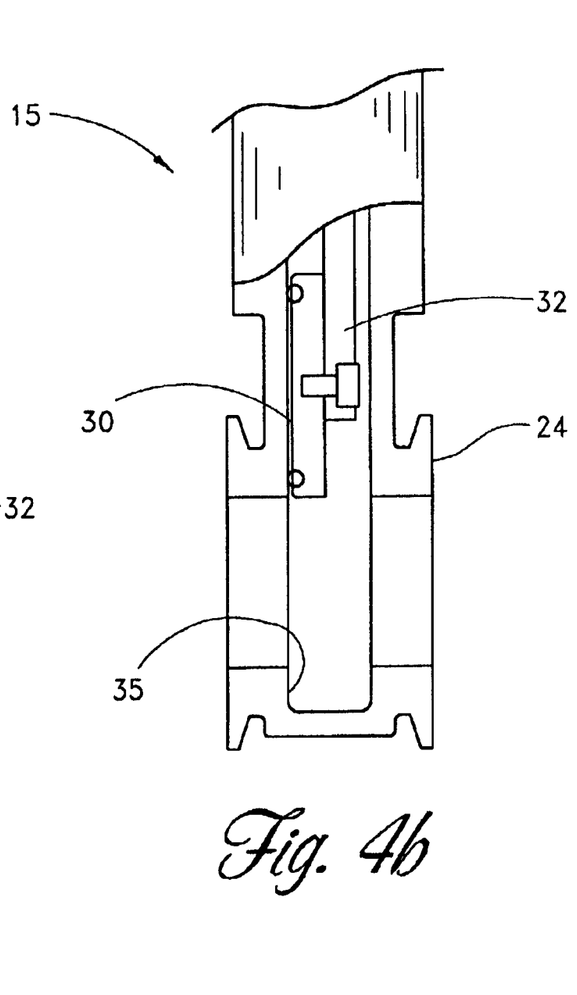

In FIG. 4, the cross-section of the valve 15 used in the present embodiments is shown. FIG. 4(a) shows a closed state of the valve 15 while FIG. 4(b) shows an open state of the valve 15. The valve 15 comprises a body 24 made of aluminum or aluminum alloy. A valve body 30 is fixed to a shaft 32 by a bolt 33. On the valve body 30, an O-ring 34, which attains airtightness by sealing the inside 35 of the body 24, is mounted. At an upstream opening 22 of the valve 15, portions of the piping 14 (FIG. 3) to be connected to the remote plasma discharge chamber can be mounted. At a downstream opening 23, portions the piping 14 to be connected to the gas exit port 7 can be mounted. The mounting direction at the openings 23 and 22 is not limited and can be changed according to circumstances. Material used for the body 24 of the valve 15 is not limited to aluminum or aluminum alloy. Other materials that have excellent resistance to corrosion, such as stainless steel, can also be used. The valve body 30 is made of aluminum or aluminum alloy, but metals excellent in corrosion resistance such as nickel, titanium, stainless steel or resins excellent in corrosion resistance such as polyimide resin can be used. Additionally, the bolt 33 and the shaft 32 are made of metals that have excellent resistance to corrosion, such as aluminum, aluminum alloy, nickel and stainless steel. The O-ring 34 comprises an elastic material that is resistant to deterioration by the flowing gas to be used. The O-ring 34 preferably comprises fluorine-containing rubber, and more preferably a perfluoroelastomer.

Regarding the valve 15 used in this embodiment, in its closed state, the valve body 30 is at the position shown in FIG. 4(a). The O-ring 34 mounted on the valve body 30 seals the inside 35 of the body 24. As shown in FIG. 4(b), when the valve 15 is open, the valve body 30 is pulled up into the space 36 within the body 24 of the valve 15 and is stored. The vertical motion of the valve body 30 is performed by moving the shaft 32 by a driving mechanism (not shown) of the valve 15. Importantly, as shown in FIG. 4(b), when the valve 15 is open, the valve body 30 and the shaft 32 are stored entirely within the space 36 and are completely removed from the passage defined between the opening 23 and the opening 22. Thus, when the valve body 30 is in the position of FIG. 4(a), there is no structure hindering cleaning gas flowing through the valve 15.

Referring again to FIG. 3, for cleaning gas flowing in from the cleaning gas inlet port 12, fluorine-containing gases such as nitrogen fluoride, carbon fluoride and chlorine fluoride, mixed gas of nitrogen or carbon fluoride or mixed gases of those gases with oxygen or inactive gas can be used. Specifically, mixed gases of $NF_3$, $ClF_3$, $CF_4$, $C_2F_6$, $C_3F_8$ with oxygen, mixed gas of $NF_3$ with nitrogen, mixed gas of $NF_3$ with dilute gas can be used. For dilute gas, helium, argon, neon, xenon, or krypton can be used.

Plasma CVD Operation

Referring still to FIG. 3, operation of the plasma CVD device according to this embodiment is explained. As described above, operation is roughly divided into two sequences: (1) thin film formation on the semiconductor wafer 9, and (2) cleaning the inside of the reaction chamber. The thin film formation sequence is explained by reference to forming silicon oxide onto the semiconductor wafer 9 as an example.

First, the inside of the reaction chamber 2 is evacuated and exhausted by an external vacuum pump (not shown) through the outlet 20. Pressure within the reaction chamber can be regulated in a range from 1 Torr to 8 Torr by the angle of opening of the conductance-controlling valve 21.

Next, the support 3 heated by the heating element 26 controls the semiconductor wafer 9 at a designated temperature, preferably 300° C.–420° C. (572° F.–788° F.) using the temperature controller (not shown).

Subsequently, reaction gases, $SiH_4$, $NH_3$ and $N_2$, the flow of which is controlled by the mass flow controller (not shown), flow in from the reaction gas inlet port 5 and are brought into the showerhead 4 through the gas exit port 7 after passing through the valve 6. In this case, an influx of $SiH_4$, $NH_3$ and $N_2$ gases into the remote plasma discharge chamber 13 is prevented by closing the valve 15. The reaction gases are injected uniformly from the fine holes formed at the lower side of the showerhead 4 onto the semiconductor wafer 9.

Radio-frequency power of 13.56 MHz or mixed power of 13.56 MHz and 430 kHz is applied to the showerhead 4 by the radio-frequency oscillator 8. As a result, a plasma reaction domain is formed in the space between the showerhead 4, which constitutes one electrode, and the support 3, which constitutes another electrode. Molecules of the reaction gas within that domain are activated by plasma energy and silicon nitride is formed on the semiconductor substrate 9.

Upon termination of thin film formation processing, the valve 6 is closed and at the same time the valve 18 is opened. The processed semiconductor wafer 9 is carried out to an adjoining transfer chamber (not shown) by an automatic transfer robot (not shown) through the opening 19. After the reaction chamber 2 is evacuated and exhausted, an unprocessed semiconductor wafer is carried in from the transfer chamber, the gate valve 18 is closed, and the above sequence is repeated.

While the thin film formation sequence is continuously preformed, undesirable products adhere to the inner wall of the reaction chamber 2 and the surface and sides of the support. Undesirable products gradually accumulate, slough, and float within the reaction chamber to cause particle contamination. Consequently, it is necessary to clean the inside of the reaction chamber 2 regularly (for example, every after thin film formation sequence between wafer unloading and loading the next wafer). In the following, a cleaning sequence to remove silicon nitride adhering to the inner wall of the reaction chamber 2 is explained.

Cleaning Operation

Mixed gas of $NF_3$ and argon that is used as cleaning gas is controlled at the designated flow, flows into the cleaning gas inlet port 12 and is brought into the remote plasma discharge chamber 13. Preferred flow rates for the fluorine-containing gas are between about 0.5 slm and 1.5 slm; preferred flow rates for the carrier gas are about 0.5 slm and 4 slm. Desirably, the inert carrier gas is about 2 to 3 times the flow of the fluorine-containing gas. Inside of the remote plasma discharge chamber 13, radio frequency (RF) output from 300 kHz to 500 kHz is applied to cleaning gas with electricity from 1,000 W to 5,000 W. The value of radio frequency output is set so that unnecessary products adhering to the inside of the reaction chamber 2 are removed at an acceptable rate. To realize long-term quality maintenance of the remote plasma discharge chamber and to achieve high efficiency in generating fluorine active species, a preferable range for radio frequency output range is from 1,500 W to 3,000 W and a more preferred range is from 2,000 W to 3,000 W. With this energy, cleaning gas is dissociated and activated at a certain efficiency to generate fluorine active species.

Generated fluorine active species is brought into the showerhead 4 through the piping 14 and the valve 15. Fluorine active species that is jetted out uniformly into the inside of the reaction chamber 2 from the showerhead 4 causes chemical reaction with solid silicon nitride adhering to the inner wall and other surfaces of the reaction chamber and changes the solid adhesive substance to a gaseous substance. As a result, the number of gas molecules within the reaction chamber increases, but pressure within the reaction chamber is maintained at a specific value by a controller 28 that controls the opening angle of the conductance controlling valve 21 in real-time in response to pressure values within the reaction chamber measured by the pressure gauge 28a.

The piping 14 and the valve 15 are preferably heated at a temperature from 100° C. to 200° C. (from 212° F. to 392° F.), facilitating rapid purging of the gas flowing inside. When $NH_3$ gas is used to form silicon nitride on the semiconductor wafer 9 and cleaning gas containing fluorine active species is used to clean the reaction chamber 2, solid ammonium fluoride is generated if $NH_3$ and fluorine active species are mixed, and the inside of the piping 14 is contaminated. To remove each gas quickly from the inside of the piping 14, the piping 14 and the valve 15 are more preferably heated at least at 120° C. (248° F.). When TEOS, [Si(OC2H5)4] is used as reaction gas, heating the piping 14 and the valve 15 to at least 120° C. (248° F.) also prevents liquifying TEOS as it flows. The temperature of the valve 15 and the piping 14 is determined according to the type of reaction gas to flow into the reaction chamber 2, but restricted by the heat-resistance temperature of the valve 15. In the illustrated embodiment, the upper limit of the temperature is about 200° C. (392° F.).

In one experiment, when 1 slm of $NF_3$ and 2 slm of Ar were used for the cleaning gas, with the pressure within the reaction chamber set between 1 Torr and 1.5 Torr. Fluorine active species were generated by applying 400 kHz radio frequency power about 2,700 W to the inside of the remote plasma discharge chamber, undesirable silicon nitride adhering to the inner wall of the reaction chamber 2 was removed at greater than 2.0 microns/minute, more particularly at about 2.5 microns/minute.

In another experiment, when 0.75 slm of $NF_3$ and 1.5 slm of Ar were used, with the pressure of the reaction chamber set at about 1 Torr, generating fluorine active species by applying 2,400 W of 400 kHz radio frequency power to the inside of the remote plasma discharge chamber resulted in removal of undesirable silicon nitride from inner walls of the reaction chamber 2 at a rate of about 2.0 micron/minute.

In another experiment, in order to remove undesirable silicon oxide, formed from TEOS as raw material, adhered inside the reaction chamber 2, 1 slm of $NF_3$ and 3 slm of argon were used for the cleaning gas. Fluorine active species were generated by applying 2,800 W of 400 kHz radio frequency electric power to the remote plasma discharge chamber 13. The products of this plasma, including activated fluorine species, were introduced to reaction chamber 2 from the remote plasma chamber 13. The silicon oxide was removed at a rate of about 1.5 $\mu$m/min.

The above concludes the explanation of the cleaning sequence.

Embodiment 4

Main Structures

Figure 5:
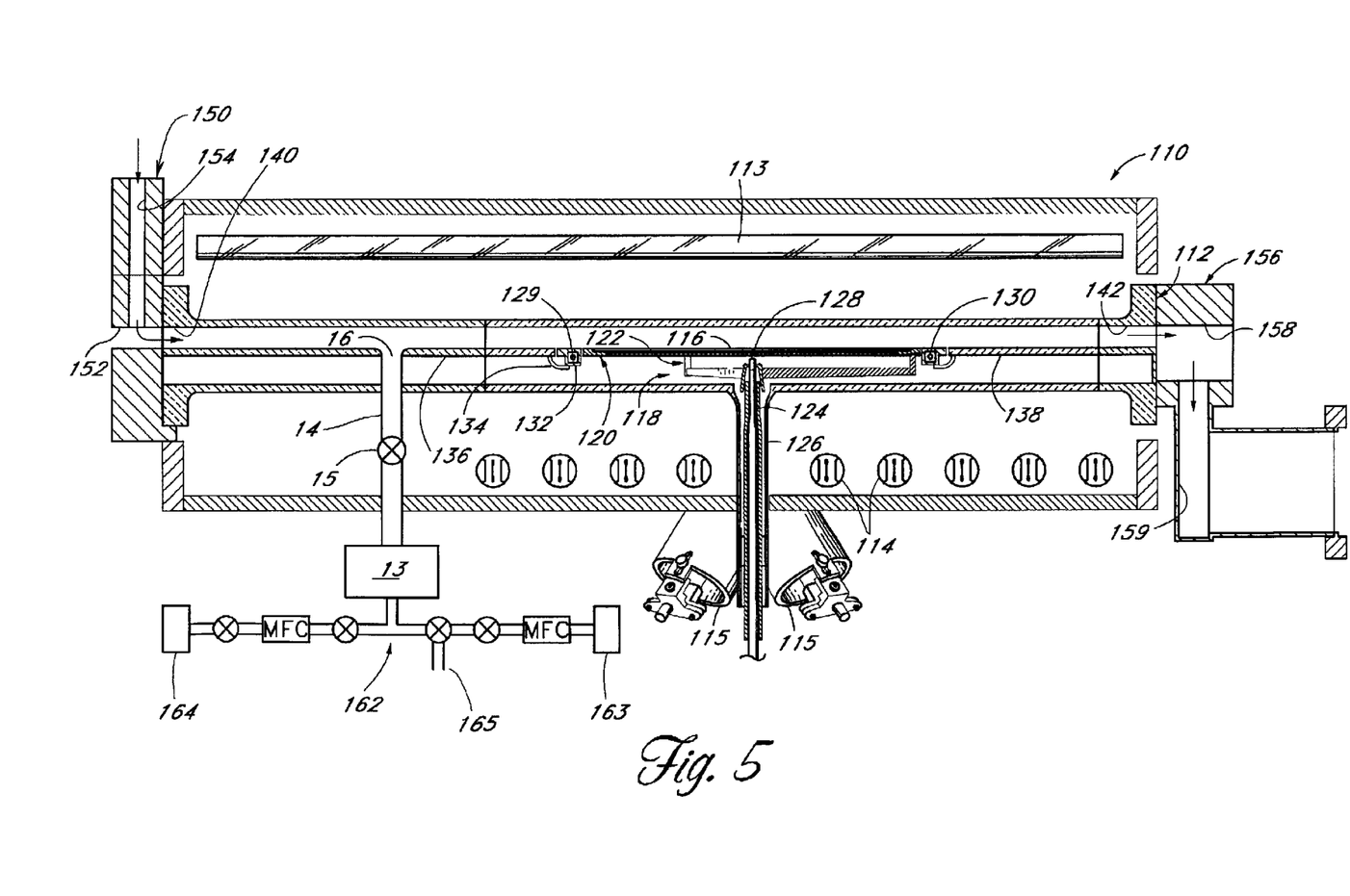
FIG. 5 is a schematic diagram showing a cross-sectional view of a substrate-processing device according to a fourth embodiment of the present invention.

With reference now to FIG. 5, a chemical vapor deposition (CVD) device 110 is illustrated in accordance with a fourth embodiment of the invention. Unlike the previously described embodiments, the illustrated CVD reactor 110 includes a cold-wall reaction chamber 112. In the illustrated embodiment, the deposition or reaction chamber 112 comprises quartz, which is transparent to certain wavelengths of radiant energy, which will be understood in view of the description of the heating system described below.

While originally designed to optimize epitaxial deposition of silicon on a single substrate at a time, the superior processing control has been found to have utility in thermal and/or remote plasma CVD of a number of different materials. The basic configuration of the device 110 is available commercially under the trade name Epsilon® from ASM America, Inc. of Phoenix, Ariz.

A plurality of radiant heat sources is supported outside the chamber 112 to provide heat energy in the chamber 112 without appreciable absorption by the quartz chamber 112 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 113. The upper heating elements 113 are preferably disposed in spaced-apart parallel relationship and also substantially parallel with the reactant gas flow path through the underlying reaction chamber 112. A lower heating assembly comprises similar elongated tube-type radiant heating elements 114 below the reaction chamber 112, preferably oriented transverse to the upper heating elements 113. Desirably, a portion of the radiant heat is diffusely reflected into the chamber 112 by rough specular reflector plates (not shown) above and below the upper and lower lamps 113, 114, respectively. Additionally, a plurality of spot lamps 115 supply concentrated heat to the underside of the substrate support structure (described below), to counteract a heat sink effect created by cold support structures extending through the bottom of the reaction chamber 112.

Each of the elongated tube type heating elements 113, 114 is preferably a high intensity tungsten filament lamp having a transparent quartz envelope containing a halogen gas, such as iodine. Such lamps produce full-spectrum radiant heat energy transmitted through the walls of the reaction chamber 112 without appreciable absorption. As is known in the art of semiconductor processing equipment, the power of the various lamps 113, 114, 115 can be controlled independently or in grouped zones in response to temperature sensors.

A substrate, preferably comprising a silicon wafer 116, is shown supported within the reaction chamber 112 upon a substrate support structure 118. Note that, while the substrate of the illustrated embodiment is a single-crystal silicon wafer, it will be understood that the term "substrate" broadly refers to any workpiece on which a layer is to be deposited. Moreover, cleaning and prevention of contamination is often required in depositing layers on other substrates, including, without limitation, the deposition of optical thin films on glass or other substrates.

The illustrated support structure 118 includes a substrate holder 20, upon which the wafer 116 rests, and a support spider 122. The spider 122 is mounted to a shaft 124, which extends downwardly through a tube 126 depending from the chamber lower wall. Preferably, the tube 126 communicates with a source of purge or sweep gas which can flow during processing, inhibiting process gases from escaping to the lower section of the chamber 112.

A plurality of temperature sensors are positioned in proximity to the wafer 116. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 128, suspended below the wafer holder 120 in any suitable fashion. The illustrated central thermocouple 128 passes through the spider 122 in proximity to the wafer holder 120. The device 110 further includes a plurality of secondary or peripheral thermocouples, also in proximity to the wafer 116, including a leading edge or front thermocouple 129, a trailing edge or rear thermocouple 130, and a side thermocouple (not shown). Each of the peripheral thermocouples is housed within a slip ring 132, which surrounds the substrate holder 120 and the wafer 116. Each of the central and peripheral thermocouples are connected to a temperature controller, which sets the power of the various heating elements 113, 114, 115 in response to the readings of the thermocouples.

In addition to housing the peripheral thermocouples, the slip ring 132 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 132 can reduce the risk of radial temperature non-uniformities across the wafer 116. The slip ring 132 can be suspended by any suitable means. For example, the illustrated slip ring 132 rests upon elbows 134, which depend from a front chamber divider 36, and a rear chamber divider 38. The dividers 36, 38 desirably are formed of quartz. In some arrangements, the rear divider 138 can be omitted.

The illustrated reaction chamber 112 includes an inlet port 140 for the injection of reactant and carrier gases for deposition by CVD, and the wafer 116 can also be received therethrough. An outlet port 142 is on the opposite side of the chamber 112, with the wafer support structure 118 positioned between the inlet 140 and outlet 142.

An inlet component 150 is fitted to the reaction chamber 112, adapted to surround the inlet port 140, and includes a horizontally elongated slot 152 through which the wafer 116 can be inserted. A generally vertical inlet 154 receives gases from remote sources and communicates such gases with the slot 152 and the inlet port 140. The inlet 154 can include gas injectors as described in U.S. Pat. No. 5,221,556, issued Hawkins et al., or as described with respect to FIGS. 21–26 in U.S. patent application Ser. No. 08/637,616, filed Apr. 25, 1996, the disclosures of which are hereby incorporated by reference. Such injectors are designed to maximize uniformity of gas flow for the single-wafer reactor.

An outlet component 156 similarly mounts to the process chamber 112 such that an exhaust opening 158 aligns with the outlet port 142 and leads to exhaust conduits 159. The conduits 159, in turn, can communicate with suitable vacuum means (not shown) for drawing process gases through the chamber 112. In the preferred embodiment, process gases are drawn through the reaction chamber 112 and a downstream scrubber (not shown). A pump or fan is preferably included to aid in drawing process gases through the chamber 112, and to evacuate the chamber for low pressure processing.

Wafers are preferably passed from a handling chamber (not shown), which is isolated from the surrounding environment, through the slot 152 by a pick-up device. The handling chamber and the processing chamber 112 are preferably separated by a gate valve (not shown) of the type disclosed in U.S. Pat. No. 4,828,224, the disclosure of which is hereby incorporated herein by reference.

Remote Plasma Discharge Chamber

The preferred device 110 also includes a source of excited species positioned upstream from the chamber 112. The excited species source of the illustrated embodiment comprises a power generator connected to a remote plasma discharge chamber 13. The remote plasma discharge chamber 13 is connected to the deposition chamber 112 by way of piping 14 having a valve 15 thereon. One end of the piping 14 constitutes a cleaning gas inlet port 12 to cause cleaning gas to flow into the remote plasma discharge chamber 13. The other end of the piping 14 constitutes a cleaning gas exit port 16 to bring cleaning gas into the horizontal flow path defined between the inlet 140 and outlet 142 of the reaction chamber 112.

The inlet end 12 of the piping 14 is shown connected to multiple gas sources. In particular, a source of cleaning gas 163 is coupled to the inlet end 12 of the piping for introduction of cleaning gas into the remote plasma discharge chamber 13. A source of carrier gas 164 is also preferably coupled to the gas line 12. As is known in the art, the gas sources 163, 164 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the remote plasma discharge chamber and thence into the reaction chamber 112.

One or more further branch lines 165 (one shown) can also be provided for additional reactants. Advantageously, source gases connected to the branch line(s) can be connected to sources useful for plasma assisting deposition within the chamber. Thus, the remote plasma discharge chamber 13 can be used not only for cleaning, but also for providing activated reactants for plasma CVD. Alternatively, a separate remote plasma source can be provided for deposition reactants.

The chamber 13, piping 14 and valve 15 can be as described above with respect to any of the embodiments of FIGS. 1–4. As noted above, the valve 15 can be optionally omitted, and replaced with a flow of carrier or inert gas through the remote plasma discharge chamber 13 (without applying dissociating energy) during the deposition phase of the process.

CVD Operation

The device 110 of FIG. 5 can be used for depositing films of various compositions by CVD, including epitaxial silicon, polysilicon, silicon oxide and silicon nitride. Advantageously, the remote plasma discharge chamber 13 can provide activated reactants for assisting reactions in CVD, thus lowering thermal needs for this deposition.

In an exemplary silicon nitride deposition, about 1.5 slm ammonia ($NH_3$) and 15 sccm silane ($SiH_4$) are introduced. Nitrogen continues to flow at the same flow rate, and temperature and pressure are maintained at about 780° C. and 50 Torr. Ammonia and silane flow are continued for about 90 seconds, reacting at the substrate surface to deposit 430 a layer of silicon nitride with a thickness of about 3 nm. As noted, one or more of the reactants can be activated through the remote plasma discharge chamber 13, thus lowering the temperature for the same deposition rate. In this case, the reaction chamber pressure is preferably reduced to facilitate plasma ignition within the remote plasma discharge chamber.

In an exemplary polysilicon deposition, a carrier flow of $N_2$ gas is maintained at about 15 slm while about 350 sccm silane is introduced. Employing disilane can advantageously improve deposition rates. Pressure continues to be maintained at about 50 Torr, and the temperature held steady at about 680° C. Within about 120 seconds, a polysilicon electrode layer of about 150 nm is deposited 637. It will be understood that the polysilicon formed by this method would be doped for appropriate conductivity after deposition 637, though in situ doping (during deposition) is also contemplated. For in situ doping, common doping sources such as phosphine, arsine or diborane can be added to the silane flow. In another arrangement, the chamber can be backfilled to about atmospheric pressure for an $H_2/SiH_4$ polysilicon process. As noted, one or more of the reactants can be activated through the remote plasma discharge chamber 13, thus lowering the temperature for the same deposition rate. In this case, the reaction chamber pressure is preferably reduced to facilitate plasma ignition within the remote plasma discharge chamber.

In still other arrangements, the polysilicon layer is in situ doped with germanium in order to lower the electrical workfunction at the gate/dielectric interface. For example, a germane (1.5% in $H_2$) flow of about 100 sccm to 1,000 sccm can be added to the silane flow. In this case, the temperature of the deposition is preferably maintained between about 550° C. and 650° C., more preferably at about 600° C.±15° C. A germanium content in the resulting poly-SiGe layer is about 10% to 60%. As noted, one or more of the reactants can be activated through the remote plasma discharge chamber 13, thus lowering the temperature for the same deposition rate. In this case, the reaction chamber pressure is preferably reduced to facilitate plasma ignition within the remote plasma discharge chamber.

Chamber Cleaning Operation

Depending upon the material to be cleaned, and materials within the chamber, fluorine active species can be provided through the remote plasma discharge chamber 13, as described with respect to the previous embodiments. For certain depositions, the skilled artisan will appreciate that chlorine active species and/or other active species may more efficiently clean the deposited material without excessive damage to the quartz chamber 112 walls. Suitable cleaning gases following silicon deposition, for example, include HCl or $NF_3/Cl_2$ provided through the remote plasma discharge chamber 13. Cleaning gases following silicon oxide or silicon nitride deposition can be as described with respect to the previous embodiments, and preferably include fluorine containing gases.

A process using both of the species $NF_3$ and $Cl_2$ at a temperature in the range of 20° C. to 800° C., and preferably 500° C. to 800° C., and at a pressure compatible with the remote plasma generator working range (typically 0.5 to 5 Torr for this process) can be performed in order to remove deposited layers formed of silicon, silicon nitride, silicon oxynitride and/or silicon dioxide. $NF_3$ and $Cl_2$ are dissociated when flowing through the remote plasma discharge chamber 13 by applying between about 1,000 W and 5,000 W of radio frequency energy, preferably between about 2,000 W and 3,000 W of 300 kHz to 500 kHz energy. Typically, $NF_3$, $Cl_2$ and $N_2$ flow through the remote plasma discharge chamber 13. The $N_2$ flow helps increasing the etch rate and increase the overall gas velocity. The $NF_3:Cl_2$ flow ratio and the temperature can be adjusted in order to increase the selectivity of the silicon nitride etch versus silicon dioxide, eventually to infinite, such that the silicon dioxide is untouched by the etch. Further details are provided in Suto et al, "Highly selective etching of $Si_3N_4$ to $SiO_2$ employing fluorine and chlorine atoms generated by microwave discharge", J. ELECTROCHEMICAL SOCIETY, Vol. 136, No 7, July 1989, p. 2032–2034; and Staffa et al, "Selective remote plasma etching of $Si_3N_4$ over $SiO_2$ at elevated temperature", ELECTROCHEMICAL SOCIETY PROCEEDINGS, Vol. 95-5, p. 283–289, the disclosures of which are incorporated herein by reference. High etch rates of silicon, silicon oxide and $Si_3N_4$ can be achieved.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of cleaning a chemical vapor deposition (CVD) reaction chamber with cleaning gas provided through a remote plasma discharge chamber, comprising:

dissociating cleaning gas within the remote plasma discharge chamber by applying energy with a power of less than about 3,000 W;

opening a valve on a piping after conducting a CVD reaction and prior to supplying activated species, wherein opening the valve comprises withdrawing a sealing element completely from a path to form an opening substantially as wide as internal surfaces of the piping;

supplying activated species from the remote plasma discharge chamber to the reaction chamber through the piping; and removing adhered deposits from CVD reactions on a wall of the reaction chamber at a rate of greater than or equal to about 2.0 microns/minute.

2. The method of claim 1, further comprising closing the valve after removing the adhered deposits.

3. The method of claim 1, wherein the deposits on the reaction chamber wall comprise silicon nitride.

4. The method of claim 1, wherein the cleaning gas comprises fluorine-containing gas and the activated species comprises fluorine active species.

5. The method of claim 1, wherein the applied energy has a frequency between about 300 kHz and 500 kHz.

6. The method of claim 1, wherein supplying activated species comprises flowing $NF_3$ through the remote plasma discharge chamber at a rate between about 0.5 slm and 1.5 slm.

7. The method of claim 1, wherein dissociating comprises applying energy with a power between about 2,000 W and 3,000 W.

* * * * *